(12) United States Patent
Shibuya et al.

(10) Patent No.: US 8,669,138 B2
(45) Date of Patent: Mar. 11, 2014

(54) SEMICONDUCTOR DEVICE AND METHOD FOR MANUFACTURING THE SAME

(75) Inventors: Akinobu Shibuya, Tokyo (JP); Koichi Takemura, Tokyo (JP); Akira Ouchi, Tokyo (JP); Tomoo Murakami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/549,001

(22) Filed: Jul. 13, 2012

(65) Prior Publication Data

US 2013/0005085 A1 Jan. 3, 2013

Related U.S. Application Data

(62) Division of application No. 12/526,236, filed as application No. PCT/JP2008/053651 on Feb. 29, 2008, now Pat. No. 8,237,292.

(30) Foreign Application Priority Data

Mar. 1, 2007 (JP) .................................. 2007-052103

(51) Int. Cl.
*H01L 21/60* (2006.01)

(52) U.S. Cl.
USPC ........... 438/108; 438/126; 438/112; 438/113; 257/678; 257/778; 257/E21.504; 257/E21.506

(58) Field of Classification Search
USPC .......... 438/108, 126, 112, 113; 257/E21.504, 257/E21.506
See application file for complete search history.

(56) References Cited

U.S. PATENT DOCUMENTS

| 6,373,142 B1 * | 4/2002 | Hoang ........................... 257/783 |
| 2005/0146032 A1 * | 7/2005 | Shibata ......................... 257/738 |

* cited by examiner

*Primary Examiner* — Thinh T Nguyen
(74) *Attorney, Agent, or Firm* — Sughrue Mion, PLLC

(57) ABSTRACT

A substrate and a semiconductor chip are connected by means of flip-chip interconnection. Around connecting pads of the substrate and input/output terminals of the semiconductor chip, an underfill material is injected. The underfill material is a composite material of filler and resin. Also, a first main surface of the substrate, which is not covered with the underfill material, and the side surfaces of the semiconductor chip are encapsulated with a molding material. The molding material is a composite material of filler and resin. An integrated body of the substrate and the semiconductor chip, which are covered with the molding material, is thinned from above and below.

14 Claims, 6 Drawing Sheets

SEMICONDUCTOR DEVICE AND METHOD FOR MANUFACTURING THE SAME

REFERENCE TO RELATED APPLICATION

This is a divisional application of U.S. patent application Ser. No. 12/526,236 filed on Aug. 6, 2009 and claims the benefit of its priority.

TECHNICAL FIELD

The present invention relates to a semiconductor device and a method of manufacturing the same.

BACKGROUND ART

A three-dimensional integrated semiconductor circuit device in which a plurality of semiconductor chips are stacked on a semiconductor substrate is known (see, e.g., Patent Literature 1). This three-dimensional integrated semiconductor circuit device is manufactured by stacking a plurality of semiconductor chips on a first main surface of the semiconductor substrate and thinly grinding the semiconductor substrate from the second main surface side thereof.

For manufacturing, recessed parts are provided on the first main surface of the semiconductor substrate first, and conductive portions are formed in the recessed parts. Then a plurality of semiconductor chips are stacked on the first main surface of the semiconductor substrate. An encapsulation material is in turn injected in the space around the semiconductor chips. After the three-dimensional structure is formed in this manner, the semiconductor substrate is thinned from the second main surface side until the conductive parts penetrate to the second main surface.

[Patent Literature 1] Unexamined Japanese Patent Application KOKAI Publication 2005-51150

DISCLOSURE OF INVENTION

Problem to be Solved by the Invention

However, the foregoing manufacturing method uses only one type of encapsulation material, which causes various problems. More specifically, when the space is small between the semiconductor chips and the semiconductor substrate, the encapsulation material is not injected well in the space, whereby voids are likely to occur. Moreover, when the encapsulation material is cured, the semiconductor substrate is eventually bent to a significant extent because the encapsulation material shrinks Also, when pads are formed on the second main surface of the semiconductor substrate, the semiconductor substrate is eventually deteriorated or deformed due to thermal deformation of the encapsulation material.

In view of the above, there is a call for a semiconductor device of three-dimensional structure and a method of manufacturing the same to prevent voids from forming in the encapsulation material and deformation of the substrate.

Means for Solving the Problem

A semiconductor device according to the present invention comprises:
a substrate having connecting pads which are formed on a first main surface thereof and input/output pads which are formed on a second main surface thereof, the input/output pads being connected to the connecting pads;
a semiconductor chip disposed to oppose the first main surface of the substrate, input/output terminals thereof being connected to the connecting pads;
an underfill material that is injected into a space between the substrate and the semiconductor chip; and
a molding material that encapsulates the first main surface of the substrate, which is not covered with the underfill material, and side surfaces of the semiconductor chip.

It is preferable that the semiconductor chip is disposed such that a first main surface thereof, on which a circuit is formed, opposes the first main surface of the substrate.

It is preferable that the underfill material is a composite material of filler and resin in which the maximum particle diameter of the filler is 5 μm or below and whose filler content is 40 to 60 wt %; and
that the molding material is a composite material of filler and resin whose filler content is over 75 wt % and in which the glass transition temperature of the resin is over 180° C.

Also, a method of manufacturing a semiconductor device according to the present invention comprises:
a connecting pad forming step of forming connecting pads on a first main surface of a substrate;
a connecting step of disposing a semiconductor chip such that the semiconductor chip opposes the first main surface of the substrate and connecting the connecting pads to input/output terminals provided on a first main surface of the semiconductor chip;
an underfill material injecting step of injecting an underfill material in a space between the substrate and the semiconductor chip;
a molding material forming step of forming a molding material that encapsulates side surfaces of the semiconductor chip and the first main surface of the substrate, which is not covered with the underfill material; and
a first thinning step of thinning the substrate from a side of a second main surface thereof.

It is preferable that in the connecting step, the semiconductor chip is disposed such that the first main surface thereof, on which a circuit is formed, opposes the first main surface of the substrate.

It is preferable to further comprise a second thinning step of, after the molding material forming step, thinning the semiconductor chip from a side of a second main surface thereof.

It is preferable that the underfill material is a composite material of filler and resin in which the maximum particle diameter of the filler is 5 μm or below and whose filler content is 40 to 60 wt %.

It is preferable that the molding material is a composite material of filler and resin whose filler content is over 75 wt % and in which the glass transition temperature of the resin is over 180° C.

It is preferable that in the molding material forming step, the substrate, except the second main surface thereof, and the semiconductor chip are immersed into a molding material melt and are pressed by applying pressure thereto from the side of the second main surface of the substrate at a specified temperature for a specified period in a vacuum environment, and the molding material melt is cured, so as to form the molding material.

It is preferable that in the molding material forming step, the second main surface of the substrate is fixed to a film-shaped jig, and the substrate and the semiconductor chip are immersed into the molding material melt and pressed by applying pressure thereto from a side of the film-shaped jig.

It is preferable that in the molding material forming step, a spacer is inserted between the second main surface of the substrate and the film-shaped jig, and the substrate is fixed to the film-shaped jig, so as to form the molding material that covers the second main surface of the substrate.

Effect of the Invention

The present invention enables provision of a semiconductor device of three-dimensional structure and a manufacturing method thereof for restraining occurrence of voids in an encapsulation material and deformation of the substrate.

EXPLANATION OF REFERENCE NUMERALS

Figure 1:
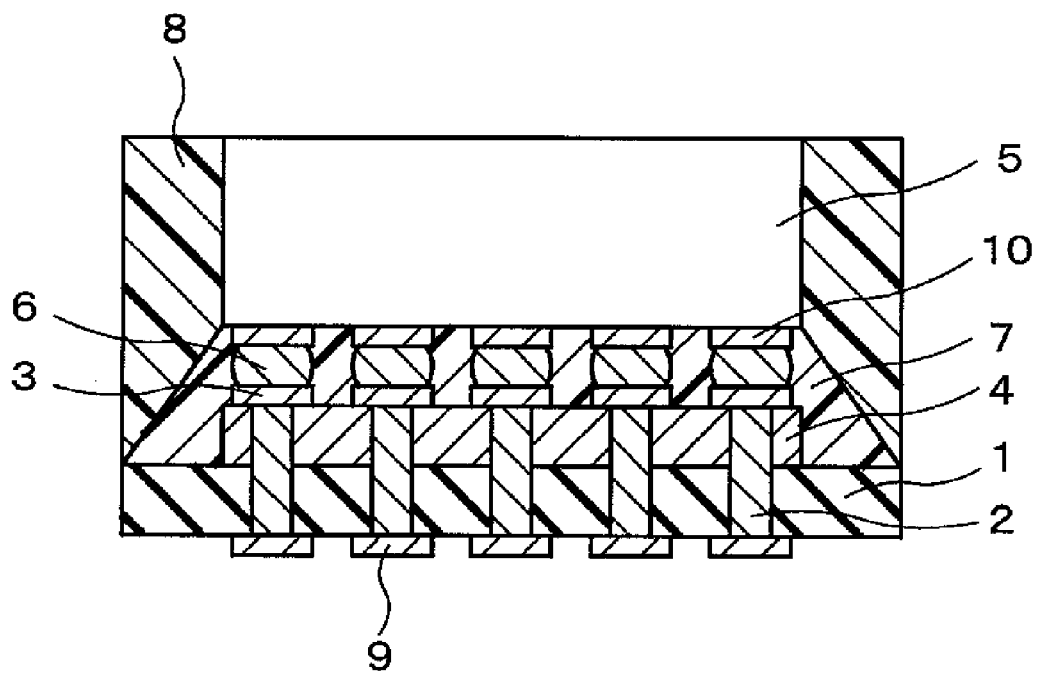
FIG. 1 is a cross-sectional diagram of the semiconductor device according to an embodiment of the present invention.

1 Substrate
2 Penetrating electrode
3 Connecting pad
4 Element
5 Semiconductor chip
6 Bump
7 Underfill material
8 Molding material
9 Input/output pad
10 Input/output terminal
11 Fan-out wiring
12 Frame jig
13 Adhesion film
14 Molding material melt
15 Cavity form
16 Press platen
17 Press direction
18 Spacer
19 Through hole
20 Vertical electrode

BEST MODE FOR CARRYING OUT THE INVENTION

The text to follow specifically explains embodiments of the present invention by referring to the attached drawings. FIG. 1 is a cross-sectional diagram illustrating the semiconductor device according to an embodiment of the present invention.

As shown in FIG. 1, the semiconductor device according to the present embodiment has a substrate 1 on whose surface elements 4 are formed. Used as the substrate 1 is, e.g., a semiconductor substrate with a smooth surface, which is made of silicon (Si) or gallium arsenide (GaAs) so that elements can be formed on the substrate. A high-resistance silicon substrate is in particular an easy semiconductor substrate to process, and another preferable of such type of substrate is high-speed signal propagation. An insulating substrate made of glass, sapphire, ceramics, resin, and the like can be used as well. To achieve high-speed signal propagation, effortless formation of an electrode penetrating through the substrate 1, and reduction of the thickness of semiconductor devices, the thickness of the substrate 1 should be preferably below 100 µm, below 50 µm in particular. Also, when forming a hole on the substrate 1 through which an electrode penetrates, the thickness of the substrate 1 is preferably below 30 µm. Hereinafter, the surface of the substrate 1 on which the elements 4 are formed is referred to as the first main surface, and the opposite surface thereof is referred to as the second main surface.

The elements 4 are, e.g., capacitors for decoupling of the voltage of the power supply, The elements 4 may be either active or passive. Penetrating electrodes 2 are ones that penetrate through the substrate 1, and the penetrating electrodes 2 are formed of conductive bodies with a small resistance, e.g., copper (Cu). Connecting pads 3 are formed on the elements 4 so as to be connected to the penetrating electrodes 2. However, the connecting pads 3 do not necessarily have to be formed on the elements 4, and they may be formed on the substrate 1. More specifically, as shown in FIG. 1, the penetrating electrodes 2 are formed to penetrate through the elements 4, but the penetrating electrodes 2 may be formed in an area where the elements 4 are not formed. Input/outputs pads 9 are formed on the second main surface of the substrate 1 so as to be connected to the penetrating electrodes 2.

In the semiconductor device according to the present embodiment, the semiconductor chip 5 is stacked on the elements 4. A circuit and input/output terminals 10 are formed on a first main surface of the semiconductor chip 5, which opposes the first main surface of the substrate 1. The circuit comprises, e.g., a transistor and a resistor. The connecting pads 3, the input/output pads 9, and the input/output terminals 10 of the semiconductor chip 5 are formed of conductive bodies with a small resistance, e.g., Cu. These conducting bodies have their surfaces covered with, e.g., Au (gold) and Ni (nickel) on an as-needed basis (not shown). The input/output terminals 10 of the semiconductor chip 5 and the connecting pads 3 are connected via bumps 6 by means of flip-chip interconnection. The bumps 6 are made of, e.g., a solder material or Au.

An underfill material 7 is injected between the semiconductor chip 5 and the substrate 1. The underfill material 7 is a composite material of resin and filler in which the maximum particle diameter of the filler is 5 µm or below and whose filler content is 40 to 60 wt %, as will be described below. The first main surface of the substrate 1, which is not covered with the underfill material 7, and the side surfaces of the semiconductor chip 5 are encapsulated with a molding material 8. The molding material 8 is a composite material of filler and resin whose filler content is over 75 wt % and in which the glass transition temperature of the resin is over 180° C., as will be discussed below.

As far as the semiconductor device shown in FIG. 1 is concerned, the penetrating electrodes 2 are at the positions of the input/output terminals 10 of the semiconductor chip 5. Also, the input/output pads 9 are at the positions of the input/output terminals 10 of the semiconductor chip 5. As this structure is introduced, e.g., when the elements 4 formed on the substrate 1 are capacitors, they can be used as capacitors for decoupling between the grounding terminals and the power supply terminals of the semiconductor chip 5. Power supply terminals are the input/output terminals 10 used to supply the semiconductor chip 5 with a power supply potential, and grounding terminals are the input/output terminals 10 used to supply the semiconductor chip 5 with a ground potential. For example, electrodes provided on upper portions of the elements 4 (hereinafter referred to as "top electrodes") and electrodes provided on lower portions thereof (hereinafter referred to as "bottom electrodes") are connected to the connecting pads 3, as will be described below. Then the connecting pads 3 connected to the top electrodes are connected to the power supply terminals of the semiconductor chip 5, and the connecting pads 3 connected to the bottom electrodes are connected to the grounding terminals of the semiconductor chip 5. The connecting pads 3 connected to terminals other than the power supply and grounding terminals of the semiconductor chip 5 are not connected to the bottom and top electrodes of the elements 4. Therefore, even when using the semiconductor chip 5 without a decoupling capacitor, the power supply and grounding terminal of the semiconductor chip 5 can be added with a decoupling capacitor. This addition can be made without changing the design of a mounting substrate mounted with the semiconductor device or that of an interposer according to this embodiment.

When the semiconductor chip 5 comprises a plurality of the input/output terminals 10, by means of flip-chip interconnection, the input/output terminals 10 are connected via the bumps 6 to the connecting pads 3 on the elements 4 or the penetrating electrodes 2. To protect the flip-chip interconnection, the underfill material 7 is injected between the semiconductor chip 5 and the substrate 1 or the elements 4.

It is preferable that the thermal expansion difference is small between the underfill material 7 and the semiconductor chip 5. Furthermore, when miniaturization is made to an extent where the pitch of the input/output terminals 10 is, e.g., below 200 μm or the space between the semiconductor chip 5 and the substrate 1 is minimized, the underfill material 7 needs to be injected sufficiently without causing voids to occur. It is also necessary that the filler contained in the underfill material 7 does not damage the elements 4 formed on the substrate 1 and the semiconductor chip 5.

In light of the above, a material preferable as the underfill material 7 is a composite material of resin and filler whose filler content is 40 to 60 wt % and in which the maximum particle diameter of the filler is 5 μm or below. Here, a preferable filler material is silica glass due to its low shrinkage and low thermal expansion properties. Also, silica glass with a spherical shape is even more preferable as a filler material in terms of flow property. The maximum particle diameter and content of the filler are set to 5 μm or below and 40 to 60 wt %, respectively, because it was experimentally proven that voids did not occur in the underfill material 7 and the reliability of a completed semiconductor device was high in the above ranges. The experimental results showed that when the diameter of the filler was large, voids were likely to occur, and the likelihood of void occurrence was high at filler contents over 60 wt %. Also, the temperature cycle experiment showed that failure was likely to occur at filler contents below 40 wt %. Use of the above-mentioned underfill material 7 effectively restrains occurrence of voids. Therefore, the connecting pads 3 and the input/output terminals 10 of the semiconductor chip 5, which are connected by means of flip-chip interconnection, can be protected without damaging the semiconductor chip 5 and the elements 4.

Moreover, by encapsulation the side surfaces of the semiconductor chip 5 and the first main surface of the substrate 1 with the molding material 8, some process of the manufacturing method can be made easier. The main effect is that the substrate 1 and the semiconductor chip 5 can be thinly grinded together with the molding material 8 being formed thereon, which will be explained in detail below in the embodiment of the manufacturing method. Since the substrate 1 and the semiconductor chip 5 are not be thinned separately, damage to these components can be prevented.

Also, the thickness of the substrate 1 can be reduced. The smaller the thickness of the substrate 1, the shorter the time required for forming the penetrating electrodes 2.

The molding material 8 must have low-shrinkage, low-thermal expansion, and highly heat resistant properties. A material preferable as the molding material 8 is a composite material of filler and resin whose filler content is over 75 wt % and in which the glass transition temperature of the resin is over 180° C. Here, the preferable filler material is silica glass due to its low-shrinkage and low-thermal expansion properties. Also, silica glass with a spherical shape is even more preferable in terms of flow property. It was experimentally found that the wafer was bent to a significant extent when encapsulation was made using the molding material 8 at filler contents below 75 wt %. It was also experimentally found that a semiconductor device manufactured using a resin whose glass transition temperature was below 180° C. was as well bent to a significant extent when forming input/output pads on the rear surface of the substrate. Using, as the molding material 8, a composite material of filler and resin whose filler content is over 75 wt % and in which the glass transition temperatures of the resin is over 180° C., shrinkage deformation of the substrate 1 can be effectively prevented when forming the molding material 8. Also, since the molding material 8 is highly heat resistant, the likelihood of occurrence of thermal deformation of the molding material 8 is low even at high process temperatures. Therefore, for example, a process such as forming the input/output pads 9 on the rear surface of the substrate 1 can be readily performed.

As shown in FIG. 1, it is preferable for the sake of releasing heat that the surface of the semiconductor chip 5 of a completed semiconductor device that does not oppose the first main surface of the substrate 1 is not covered with the molding material 8.

As explained above, according to the present embodiment, used as the underfill material 7 injected between the semiconductor chip 5 and the substrate 1 is a composite material of filler and resin whose filler content is 40 to 60 wt % and in which the maximum particle diameter of the filler is 5 μm or below. Therefore, when the semiconductor chip 5 is made to have high-pin counts and the space is small around the input/output terminals 10 of the semiconductor chip 5 and the connecting pads 3, which are connected by means of flip-chip interconnection, the underfill material 7 can be injected to a satisfactory extent without causing voids to occur. By setting the maximum particle diameter of the filler to 5 μm or below, the input/output terminals 10 of the semiconductor chip 5 and the connecting pads 3, which are connected by means of flip-chip interconnection, can be protected while preventing the filler from damaging the elements 4 formed on the substrate 1 and the semiconductor chip 5.

Also, in the embodiment, the first main surface of the substrate 1 and the side surfaces of the semiconductor chip 5 are encapsulated with the molding material 8, which is a composite material of filler and resin whose filler content is over 75 wt % and in which the glass transition temperature of the resin is over 180° C. The molding material 8 has low-shrinkage and low-thermal expansion properties, whereby warpage of the substrate 1, which is eventually caused by encapsulation with the molding material 8 and thinly grinding the substrate 1, can be effectively prevented. In addition, the heat-resistant property of the molding material 8 prevents thermal deformation from occurring to the molding material, e.g., when the temperature at which the input/output pads 9 are formed on the second main surface of the substrate 1 is high.

Figure 2:
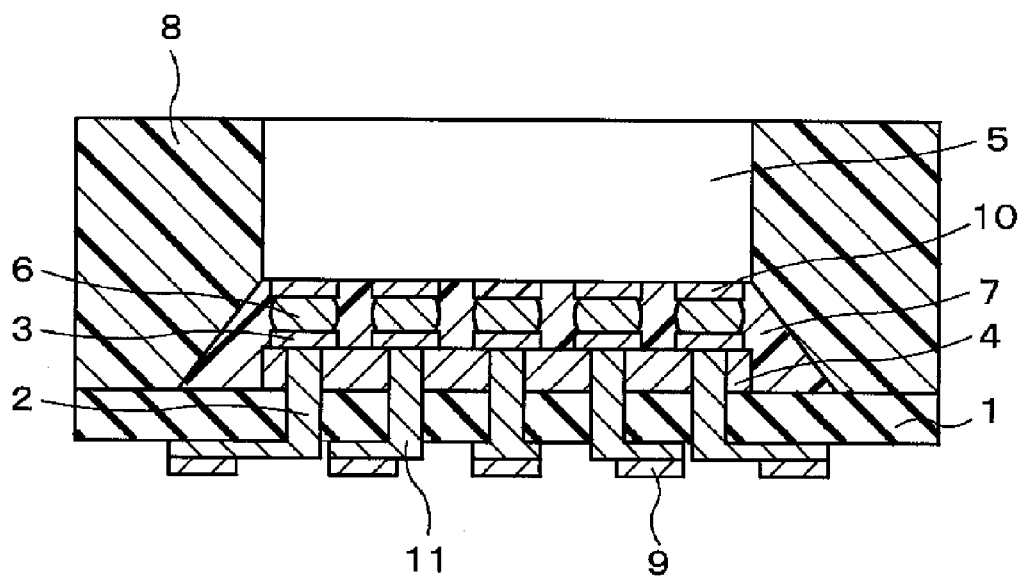
FIG. 2 is a cross-sectional diagram of a modified example of the semiconductor device according to the embodiment of the present invention.

According to the above embodiment, the input/output pads 9 are formed at the positions of the penetrating electrodes 2 on the second main surface of the substrate 1 as shown in FIG. 1, but the embodiment is not limited thereto. For example, as shown in FIG. 2, fan-out wirings 11 may be formed on the second main surface of the substrate 1, and the input/output pads 9 be formed on the fan-out wirings 11.

The text to follow explains a manufacturing method of the semiconductor device according to the embodiment of the present invention. The manufacturing method according to the present embodiment is explained in order of the processes illustrated in FIGS. 3 to 10 and FIG. 1.

Figure 3:
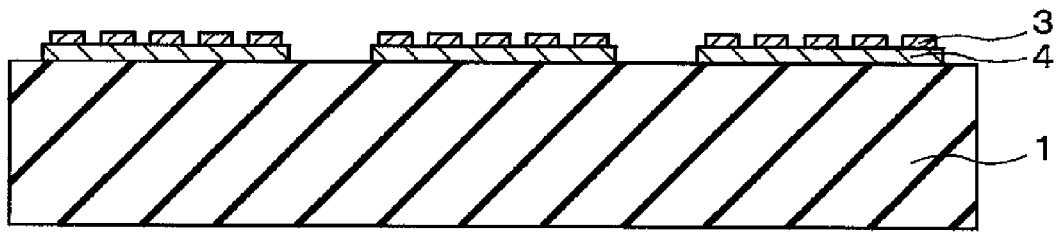
FIG. 3 is a diagram illustrating a manufacturing process of the semiconductor device according to the embodiment of the present invention.

FIG. 3 shows an example where 3×3 (=9) semiconductor devices are manufactured on one substrate 1. FIG. 3 illustrates a cross-section of the substrate 1, on whose first main surface the 3×3 (=9) elements 4 are formed. The substrate 1 is, e.g., a 4-inch glass wafer with a thickness of 500 μm.

Firstly, as shown in FIG. 3, the elements 4 are formed on the first main surface of the substrate 1. As the elements 4, e.g. nine 20-square mm capacitors of MIM (Metal Insulation Metal) structure are formed. One capacitor is formed for one semiconductor device. In this case, bottom electrodes are formed on the substrate 1 by the DC magnetron sputter-depositing method, whereby a film of Ti (titanium) and Ru (ruthenium) is formed from the substrate 1 side in the order of Ti and Ru. The film thickness of Ti and Ru is, e.g., 50 nm. Next, by the RF sputter-depositing (radio frequency sputter-depositing) method, $SrTiO_3$ (STO), to which Mn is doped, e.g., at an Mn concentration of 5%, is formed as a dielectric thin film to have a thickness of 60 nm, e.g., at 400° C. Also, on the dielectric thin film, a film of Ru is formed as a top electrode using the DC magnetron sputter-depositing method. The thickness of the Ru film is, e.g., 50 nm.

The elements 4 should be preferably protected by e.g., a Si oxide or Si nitride film, except areas thereof that are used to establish an electric connection with the input/output terminals 10 of the semiconductor chip 5. Also, the elements 4 may be formed in areas except those where the penetrating electrodes 2 are formed in the process described below.

Next, by the plasma CVD (Chemical Vapor Deposition) method using $Si(OC_2H_5)_4$(TEOS) as a material, a $SiO_2$ film with a thickness of, e.g., 1 μm is formed. Thereafter, on the $SiO_2$ film, RIE (Reactive Ion Etching) is performed to form openings through which connection can be made between the top and bottom electrodes of the capacitors as well as openings through which connection cannot be made therebetween.

Next, Cu plating is performed by using a Cu and Ti sputter-deposited film as a seed layer and a resist as a mask. Thereafter, the resist is stripped and the seed layer is removed by etching to obtain the connecting pads 3. The positions of the connecting pads 3 all agree with the positions where the penetrating electrodes 2 are to be formed. For example, the pitch is 200 μm, and the arrangement is area array. Some of the connecting pads 3 are connected to capacitors via openings formed on the $SiO_2$ film, but the others are not. In the semiconductor device according the embodiment, the connecting pads 3 corresponding to the power supply terminals of the semiconductor chips 5 connected to the capacitors are connected to the top electrodes. The connecting pads 3 corresponding to the grounding terminals are connected to the bottom electrodes. The connecting pads 3 corresponding to terminals other than the power supply and grounding terminals are not connected to capacitor elements.

In turn, on the surfaces of the connecting pads 3, by electroless plating, films of Au and Ni are formed to have thicknesses of, e.g., 0.05 μm and 5 μm, respectively. Then, Pb-free solder paste is printed on the connecting pads 3, and reflow is performed for pre-soldering.

Figure 4:
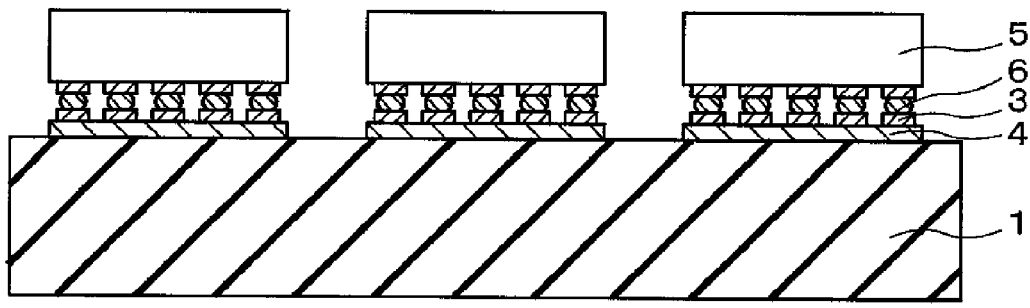
FIG. 4 is a diagram illustrating manufacturing steps subsequent to FIG. 3.

Next, as shown in FIG. 4, the substrate 1 and the semiconductor chips 5 are connected. The semiconductor chips 5 are, e.g., 20 mm-square CPUs with a thickness of 675 μm. On the semiconductor chips 5, the bumps 6 are formed in advance by Pb-free soldering. Using flux, the input/output terminals 10 of the semiconductor chips 5 and the connecting pads 3 are connected by flip-chip interconnection.

Figure 5:
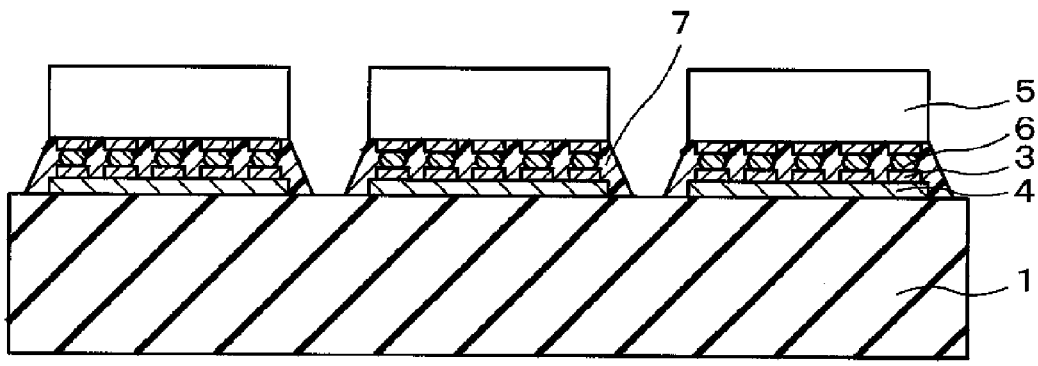
FIG. 5 is a diagram illustrating manufacturing steps subsequent to FIG. 4.

Next, as shown in FIG. 5, the underfill material 7 is injected subsequent to washing the flux. In the embodiment, used as the underfill material 7 is a composite material of filer and resin in which the filler particle diameter is 5 μm or below, e.g., 3 μm, and whose filler content is 40 to 60 wt %, e.g., 50 wt %.

Figure 6:
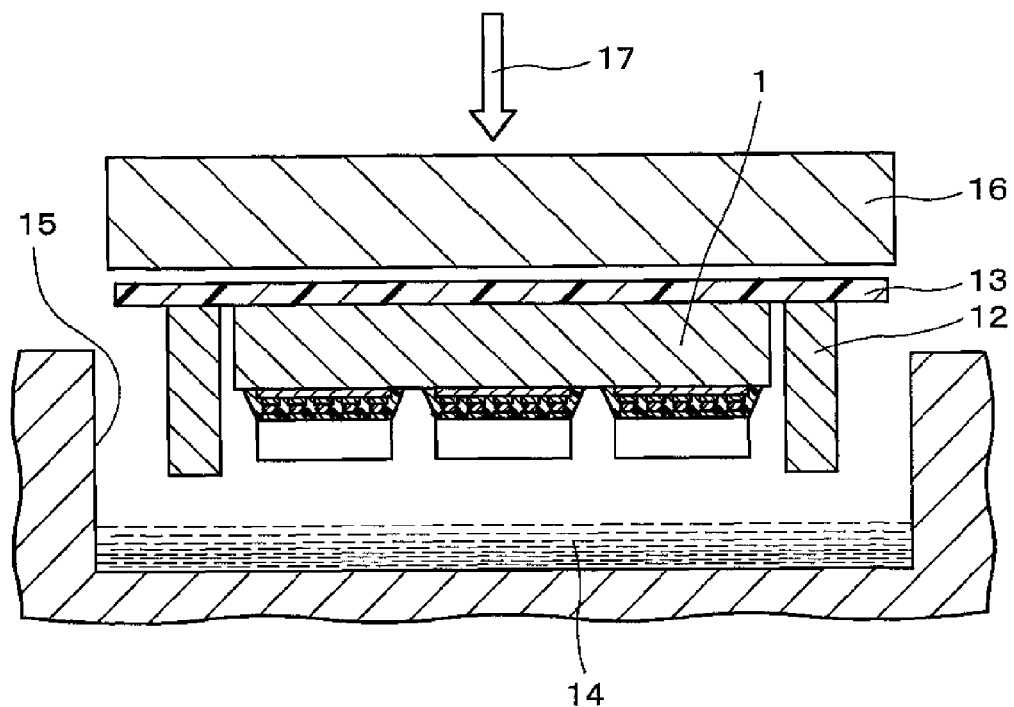
FIG. 6 is a diagram illustrating manufacturing steps subsequent to FIG. 5.
Figure 7:
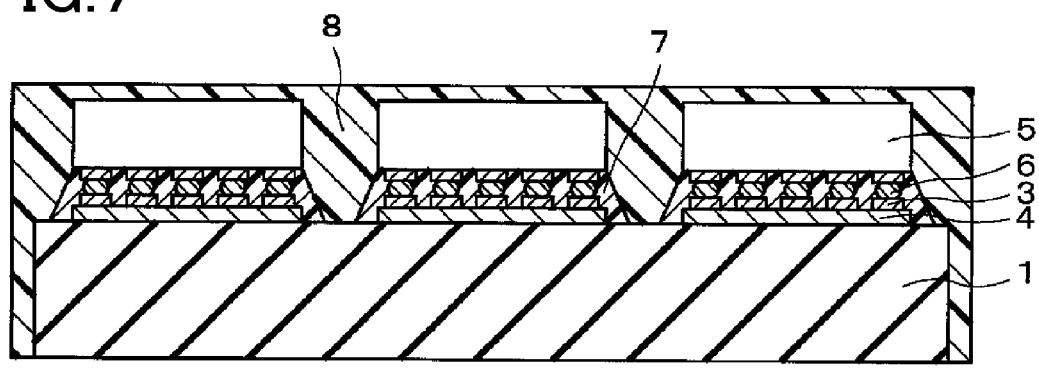
FIG. 7 is a diagram illustrating manufacturing steps subsequent to FIG. 6.

Next, as shown in FIGS. 6 and 7, by the compression molding method, the first main surface of the substrate 1, the second main surfaces of the semiconductor chips 5, and the side surfaces of the substrate 1 and the semiconductor chips 5 are encapsulated with the molding material 8. As shown in FIG. 6, the second main surface of the substrate 1 is first adhered to an adhesion film 13, which is one of the jigs used in this process. The material of the adhesion film 13 is not limited, but highly heat-resistant ones are preferable, such as a polyimide film with an adhesive. Also, as in the case of the substrate 1, frame jigs 12 are adhered to the adhesion film 13. The frame jigs 12 are provided to cover the surfaces of the substrate 1 other than the second main surface thereof, which is adhered to the adhesion film 13, with a molding material melt 14. No particular limitations apply to the frame jigs 12 as far as material is concerned. However, a metal, e.g., Cu, is preferable as the molding process and removal subsequent thereto are streamlined thereby.

Next, an integrated body of the substrate 1 and the frame jigs 12 adhered to the adhesion film 13 is immersed into the molding material melt 14 in a cavity form 15, so that the adhesion film 13 is on top. Thereafter, pressure is uniaxially applied in the press direction 17 by a press platen 16. The molding material 8 is a composite material of filler and resin whose filler content is over 75 wt % and in which the glass transition temperature of the resin is over 180° C. To cure the molding material melt 14, for example, it is pressed by applying pressure thereto in a vacuum environment at 175° C. for two hours. As a result of the above, as shown in FIG. 7, the molding material 8 is formed on the first main surface of the substrate 1, the second main surfaces of the semiconductor chips 5, and the side surfaces of the substrate 1 and the semiconductor chips 5.

In the manufacturing method according to the present embodiment, due to the low-shrinkage and low-heat expansion properties of the molding material 8, the deformation (warpage) of the substrate 1 can be restrained after the molding material 8 is formed. Using the compression molding method, whereby resin hardening and cooling can be performed with pressure being exerted, deformation of the substrate 1 can be effectively prevented after formation of the molding material 8.

Also, in the manufacturing method according to the present embodiment, the use of the frame jigs 12 obviates the need for manufacturing the cavity form 15, which is expensive, for various sizes of the substrate 1. The frame jigs 12 are manufactured according to the height of the molding material 8 to be formed, but the cavity form 15 may be manufactured according to the size of the substrate 1.

In the manufacturing method according to the present embodiment, the material of the molding material 8 is powdery or granular. After a required amount of the material of the molding material 8 is laid in the cavity form 15, it is melted for press processing.

Figure 8:
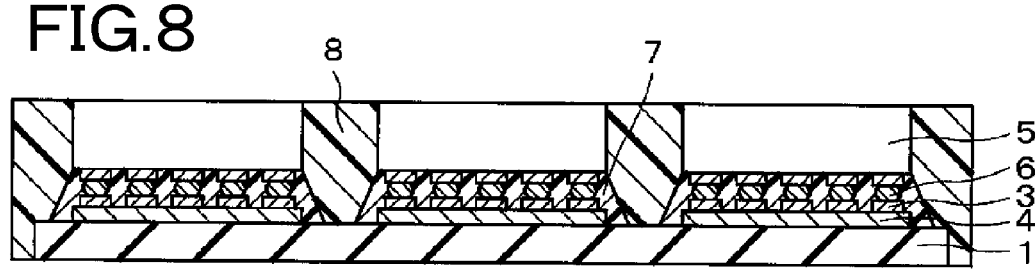
FIG. 8 is a diagram illustrating manufacturing steps subsequent to FIG. 7.

Next, as shown in FIG. 8, the semiconductor chips 5 and the substrate 1, which are covered with the molding material 8, are grinded. Firstly, the molding material 8 covering the second main surfaces of the semiconductor chips 5 is grinded until the second main surfaces thereof are exposed.

In the embodiment, the semiconductor chips 5 are disposed such that the first main surfaces thereof, on which circuits including transistors exist, oppose the substrate 1. In other words, no circuits exist on the second main surfaces of the semiconductor chips 5, which are to be grinded. Thus, grinding the molding material 8, which covers the semiconductor chips 5, does not affect the feature of the semiconductor chips 5.

Next, the integrated body of the semiconductor chips 5 and the substrate 1 is grinded to an extent where its total thickness is reduced to, e.g., 800 μm. Thereafter, the substrate 1 is grinded from the second main surface side thereof for thinning the substrate 1 to reduce its thickness to, e.g., 20 μm.

After grinding the substrate 1, the molding material 8 covering the second main surfaces of the semiconductor chips 5 may be grinded. In addition, methods other than grinding can be adopted, but grinding is suitable for the manufacturing method according to the present embodiment in terms of speed and flatness.

Figure 9:
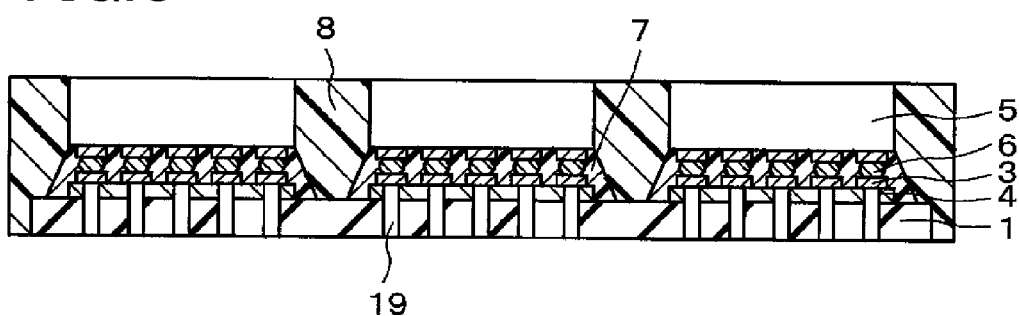
FIG. 9 is a diagram illustrating manufacturing steps subsequent to FIG. 8.

Next, by means of RIE, the second main surface of the substrate 1 is etched by, e.g., 2 μm. Here, to reduce the thickness of the substrate 1, drying etching is performed after grinding to remove scratches produced by grinding, which effectively restrains warpage of the substrate 1. Thereafter, as shown in FIG. 9, using a resist as a mask, the through holes 19 are formed from the second main surface of the substrate 1 by RIE so that the internal diameter thereof is, e.g., 50 μm.

Figure 10:
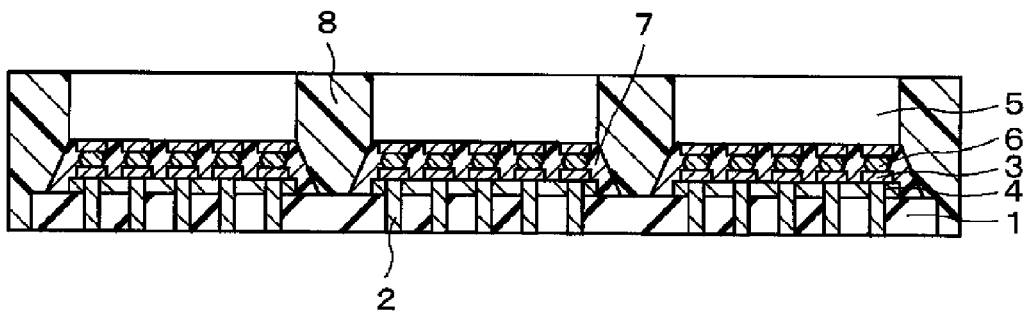
FIG. 10 is a diagram illustrating manufacturing steps subsequent to FIG. 9.

Next, a seed layer of Cu and Ti is formed in the through holes 19 by the sputter method, and using a resist as a mask, Cu plating is performed by electrolytic filling plating. The penetrating electrodes 2 are thereby formed, as shown in FIG. 10. As the number of pins of the semiconductor chips 5 connected thereto increases—i.e., the pitch becomes narrower—the aspect ratio of the penetrating electrodes 2 increases. Therefore, it is preferable to form the penetrating electrodes 2 of low-resistance materials, such as Cu, by filling plating. Also, when forming the penetrating electrodes 2, the input/output pads 9 shown in FIG. 1 are simultaneously formed.

Finally, the integrated body of the substrate 1 and the semiconductor chips 5 is cut for each of the semiconductor chip 5 by dicing saw to obtain the semiconductor device shown in FIG. 1.

Covering the substrate 1 and the semiconductor chips 5 with the molding material 8 produces various effects.

Firstly, the integrated body of the substrate 1 and the semiconductor chips 5, which is covered with molding material 8, is thinly grinded. Therefore, the substrate 1 and the semiconductor chips 5 do not have to be thinned separately. For example, unlike traditional practices, thinning of the substrate 1 does not require temporary fixing to a seating substrate.

Secondly, as mentioned above, the substrate 1 does not need to be thinned separately. Therefore, the substrate 1 can be manufactured to have a thickness that is smaller than the thickness of the separately thinned substrate 1. Traditionally, for example, when a silicon substrate is separately thinned, defects, such as cracks, frequently occurred at substrate thicknesses about below 50 μm. In the manufacturing method according to the present embodiment, however, even when the substrate 1 is thinly grinded to have a thickness below 20 μm, very few defects occur. Moreover, the amount of etching required for forming the through holes 19 can be reduced by decreasing the thickness of the substrate 1. The time required for forming the through holes 19 can be thereby shortened. Likewise, the time required for forming the penetrating electrodes 2 can be shortened as well.

Thirdly, the molding material 8 is a composite material of filler and resin whose filler content is over 75 wt % and in which the glass transition temperature of the resin is over 180° C. Accordingly, even when manufactured at high temperatures, the connection between the semiconductor chips 5 and the substrate 1 does not become defective and the substrate 1 is not deformed due to thermal deformation of the molding material 8. Therefore, for example, drying etching and formation of an insulation film and the input/output pads 9 on the second main surface of the substrate 1 can be easily performed.

Fourthly, the molding material 8 is formed by applying thereto pressure in a vacuum environment. Occurrence of voids can be thus effectively restrained during formation of the molding material 8.

Further, for example, the first main surface of the substrate 1 and the side surfaces of the semiconductor chips 5 are covered with the molding material 8. Therefore, when the second main surface of the substrate 1 is thinned, failure of the substrate 1 from its edge can be prevented.

Still further, the underfill material 7 is a composite material of filler and resin in which the maximum particle diameter of the filler is 5 μm or below and whose filler content is 40 to 60 wt %. Therefore, without damaging the semiconductor chips 5 and the elements 4 due to the filler, it is possible to protect the connecting pads 3 and the input/output terminals 10 of the semiconductor chips 5, which are connected by means of flip-chip interconnection. Also, as occurrence of voids is effectively restrained in the underfill material 7 that has been injected, the underfill material 7 can be formed in such a way that it is highly reliable.

Yet still further, by forming capacitors as the elements 4 on the first main surface of the substrate 1, a capacitor for decoupling does not need to be provided outside the semiconductor device. Thus, the size of devices mounted with the semiconductor device according to the present embodiment can be thereby minimized.

The above-mentioned manufacturing method uses a glass substrate as the substrate 1. However, for example, an insulating substrate made of resin, etc. or a semiconductor substrate such as a silicon substrate may also be used as the substrate 1. When the substrate 1 is not an insulating one, the second main surface of the thinly grinded substrate 1 and the inner walls of the through holes 19 must be covered with an insulating film.

Yet still further, in the above-mentioned manufacturing method, the molding material 8 covering the second main surfaces of the semiconductor chips 5 shown in FIG. 7 is grinded to an extent where the second main surfaces of the semiconductor chips 5 are exposed. However, for example, the second main surfaces of the semiconductor chips 5 may be further thinned to reduce the thickness of a semiconductor device upon its completion.

For testing, a semiconductor device was manufactured based on the manufacturing method according to the above-mentioned embodiment. In each process, deformation of the substrate 1 and poor connection between the substrate 1 and the semiconductor chip 5 did not occur. In the process of grinding the substrate 1, the substrate 1 was grinded to reduce the thickness thereof to 20 μm, but defects, such as cracks, did not occur to the glass-made substrate. The capacitance was measured between the input/output pads 9 connected to the power supply terminal and the input/output pads 9 connected to the ground terminal of the semiconductor chip 5 of the semiconductor device manufactured for testing. The measurement was 7 μF. When this was equipped on the mounting substrate for confirmation of the operation thereof, the CPU, which is the semiconductor chip 5, operated normally without a capacitor provided outside the semiconductor device. The elements 4 were thereby confirmed to be able to function as capacitors for decoupling. The above results confirmed that a semiconductor device of three-dimensional structure—i.e., the semiconductor chip 5 and the elements 4 stacked on the substrate 1, which has been traditionally difficult to manufacture—could be easily manufactured.

Next, a manufacturing method of the semiconductor device according to another embodiment of the present invention is explained. The manufacturing method according to this other embodiment, which is different from the aforementioned manufacturing method, is illustrated in the order of the processes illustrated in FIGS. 3 to 5, FIG. 11, FIG. 12, FIGS. 8 to 10, and FIG. 1. Detailed explanations of the processes of FIGS. 3 to 5, FIGS. 8 to 10, and FIG. 1, which are identical to those of the aforementioned manufacturing method, are omitted.

The process of this manufacturing method up to the process of FIG. 5—i.e., filling the underfill material 7 between the substrate 1 and the semiconductor chips 5—are identical to those of the aforementioned manufacturing method.

Figure 11:
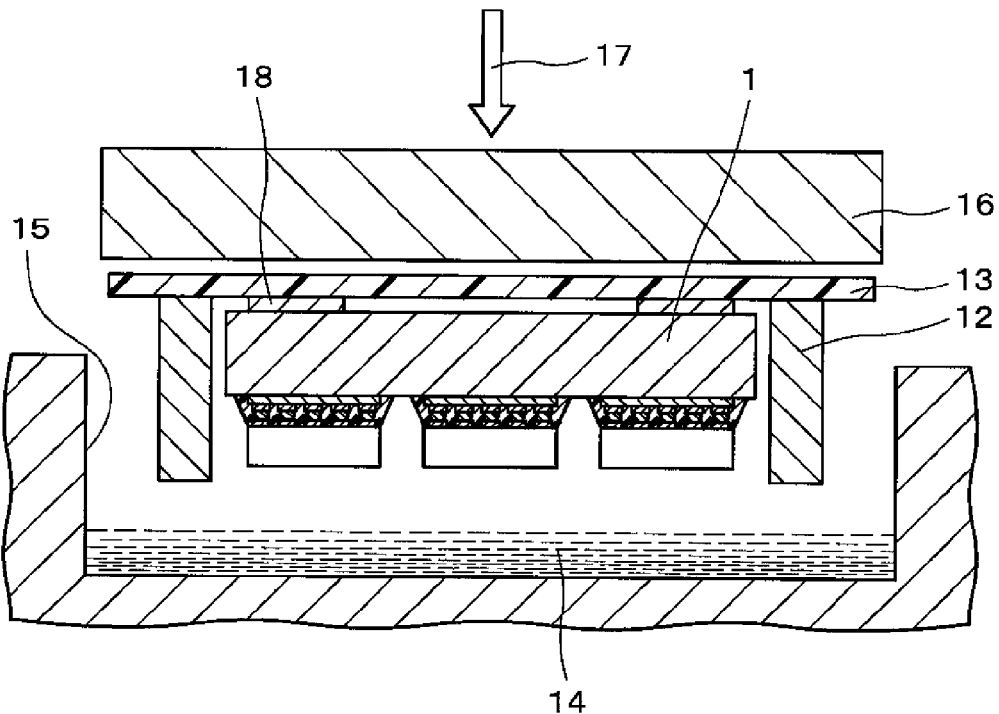
FIG. 11 is a diagram illustrating a manufacturing step of the semiconductor device according to another embodiment of the present invention.
Figure 12:
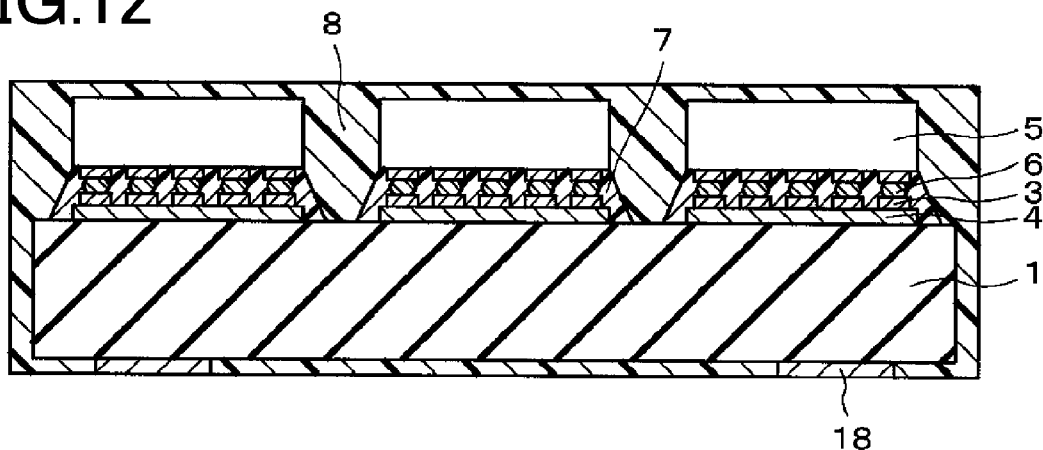
FIG. 12 is a diagram illustrating manufacturing steps subsequent to FIG. 11.

Next, as shown in FIGS. 11 and 12, the molding material 8 covering the substrate 1 and the semiconductor chips 5 is formed by the compression molding method. In this manufacturing method, the second main surface of the substrate 1 is covered with the molding material 8 as well.

Firstly, via the spacer 18, the substrate 1 is fixed to the adhesion film 13. The spacer 18 is adhered to the second main surface of the substrate 1 and the adhesion film 13, respectively. Next, as in the case of the aforementioned manufacturing method, the molding material 8 is formed by the compression molding method. As a result of the above, it is possible to obtain the substrate 1 and the semiconductor chips 5 covered with the molding material 8 as shown in FIG. 12.

In FIG. 12, the substrate 1 and the semiconductor chips 5 are entirely covered with the molding material 8, except the areas to which the spacer 18 is attached. Based on the aforesaid method illustrated in FIG. 6, a semiconductor device whose substrate 1 is bent only slightly can be manufactured. However, this manufacturing method can further reduce warpage of the substrate 1. The process of this manufacturing method subsequent to the thinning process shown in FIG. 8 is identical to that of the aforementioned manufacturing method.

Next, a manufacturing method of the semiconductor device according to still another embodiment is explained. This manufacturing method is explained in the order of the processes illustrated in FIG. 13, FIGS. 4 to 7, FIG. 14, FIG. 15, and FIG. 1. Detailed explanations of the processes of FIGS. 4 to 7 and FIG. 1 of this manufacturing method, which are identical to those of the aforementioned manufacturing methods, are omitted.

Figure 13:
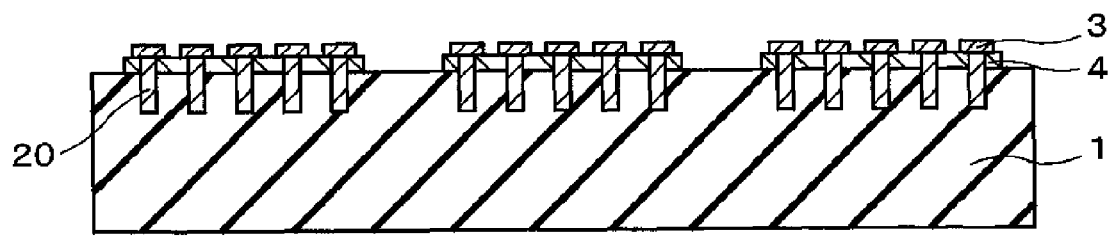
FIG. 13 is a diagram illustrating a manufacturing process of the semiconductor device according to yet another embodiment of the present invention.

In the manufacturing method of this still other embodiment, which is illustrated in FIG. 13, the processes up to forming the elements 4 on the first main surface of the substrate 1 are identical to those of the aforementioned manufacturing method, which is illustrated in FIG. 3. This manufacturing method differs from the aforementioned manufacturing method in that vertical electrodes 20, which are to be the penetrating electrodes 2 in a later process, are formed in advance.

Firstly, cavities with, e.g., a depth of 50 μm and an inner diameter of 50 μm are formed by ICP (Inductivity Coupled Plasma) etching. Subsequently, by the plasma CVD method using $Si(OC_2H_5)_4$(TEOS) as a material, a $SiO_2$ film with a thickness of, e.g., 1 μm is formed on the first main surface of the substrate 1 and the surfaces of the elements 4. As a result, a $SiO_2$ film with a thickness of about 0.4 μm is formed on the inner walls of the cavities. Next, a plating seed layer of Cu and Ti is formed, and filling plating is performed using a resist as a mask. Thereafter, by removing the resist and etching the seed layer, the vertical electrodes 20 and the connecting pads 3, as shown in FIG. 13, are formed simultaneously. The subsequent steps of this manufacturing method shown in FIGS. 4 to 7—i.e., connecting the substrate 1 and the semiconductor chips 5 to forming the molding material 8—are identical to those of the aforementioned manufacturing methods.

Figure 14:
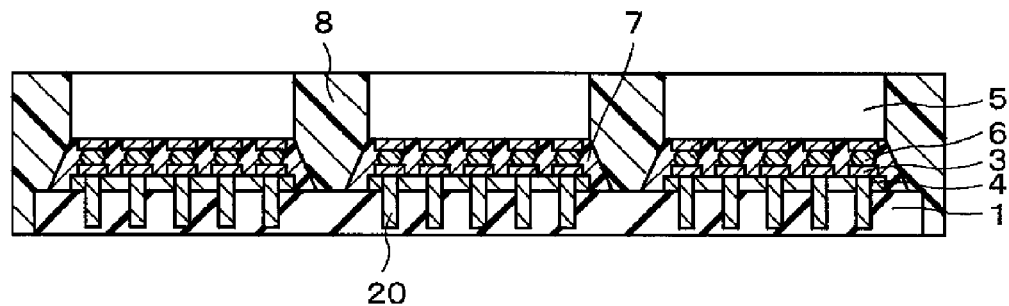
FIG. 14 is a diagram illustrating manufacturing steps subsequent to FIG. 13.
Figure 15:
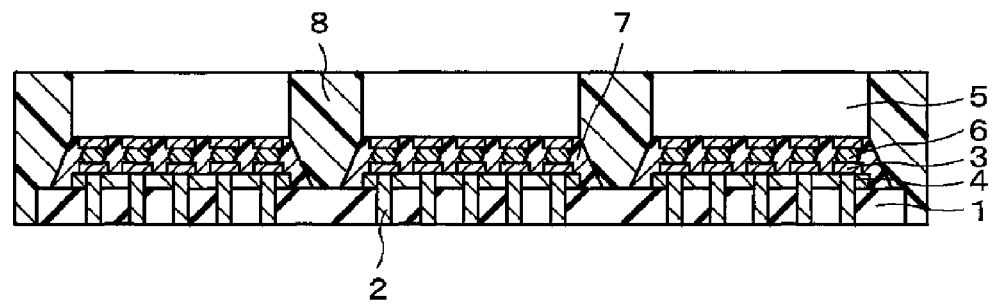
FIG. 15 is a diagram illustrating manufacturing steps subsequent to FIG. 14.

Next, as shown in FIG. 14, the integrated body of the substrate 1 and the semiconductor chips 5 covered with the molding material 8 is thinly grinded. FIG. 14 illustrates that the semiconductor chips 5 are thinned from the second main surface sides thereof to an extent where the second main surfaces of the semiconductor chips 5 are exposed and where the vertical electrodes 20 are just about to be exposed from the second main surface side of the substrate 1. Grinding is performed until the total thickness of the integrated body of the semiconductor chips 5 and the substrate 1 is reduced to, e.g., 800 μm and the thickness of the substrate 1 is reduced to, e.g., 60 μm.

Next, dry etching is performed by means of RIE or the like on the second main surface of the substrate 1 so as to expose the vertical electrodes 20. The penetrating electrodes 2 shown in FIG. 15 can be thereby obtained.

Finally, as in the case of the aforementioned manufacturing methods, the integrated body of the substrate 1 and the semiconductor chips 5 is cut for each of the semiconductor chips 5 by dicing saw to obtain the semiconductor device shown in FIG. 1.

As in the case of the aforementioned manufacturing methods, the effects produced by this manufacturing method include restraining occurrence of voids in the underfill material 7 and the molding material 8 and deformation, such as warpage, of the substrate 1.

A semiconductor device was manufactured for testing according to the above-mentioned manufacturing methods. A high-resistance silicon wafer was used as the substrate 1, and an insulating film was formed on required areas, including the second main surface of the substrate 1. The capacitance of the semiconductor device manufactured for testing based on this manufacturing method was similar to those of the semiconductor devices based on the aforementioned manufacturing methods, and the CPU was confirmed to operate normally. The above results confirmed that a semiconductor device of three-dimensional structure—i.e., the semiconductor chips 5 and the elements 4 stacked on the substrate 1, which has been traditionally difficult to manufacture—could be easily manufactured based on this manufacturing method.

In the above embodiments, examples of the semiconductor chips 5 mounted on the substrate 1 by means of flip-chip interconnection were illustrated. Three-dimensional integrated semiconductor circuits may be used instead of the semiconductor chips 5. Such three-dimensional integrated semiconductor circuits may be ones that are made by stacking a plurality of semiconductor chips.

In addition, the semiconductor chips 5 or the three-dimensional integrated semiconductor circuits may be disposed such that the surface on which the circuits of the semiconductor chips 5 or the semiconductor chips comprised in the three-dimensional integrated semiconductor circuits are formed faces a direction opposite to the substrate 1. In this case, the input/output terminals of the semiconductor chips 5 or the semiconductor chips comprised in the three-dimensional integrated semiconductor circuits, which oppose the substrate 1, are connected to the connecting pads of the substrate 1 via the electrodes penetrating through the semiconductor chips.

Embodiments of the present invention have been explained above. Modifications to these embodiments or combinations thereof that need to be made based on design considerations or other factors are considered to fall within the scope of the invention, which is related to specific examples of the invention as recited in the claims or described in the embodiments.

In addition, the present application is based on Japanese Patent Application No. 2007-052103, filed on Mar. 1, 2007. The specification, claims, drawing of this application are herein incorporated by reference in its entirety.

INDUSTRIAL APPLICABILITY

The present invention is suitably applicable to a semiconductor device of three-dimensional structure, e.g., in which capacitors are formed on a substrate surface and semiconductor chips are stacked on the capacitors.

The invention claimed is:

1. A manufacturing method of a semiconductor device comprising:
   a connecting pad forming step of forming connecting pads on a first main surface of a substrate;
   a connecting step of disposing a semiconductor chip such that the semiconductor chip opposes the first main surface of the substrate and connecting the connecting pads to input/output terminals provided on a first main surface of the semiconductor chip;
   an underfill material injecting step of injecting an underfill material in a space between the substrate and the semiconductor chip;
   a molding material forming step of forming a molding material that encapsulates side surfaces of the semiconductor chip and the first main surface of the substrate, which is not covered with the underfill material; and a first thinning step of thinning the substrate from a side of a second main surface thereof,
   wherein in the molding material forming step, the substrate, except the second main surface thereof, and the semiconductor chip are immersed into a molding material melt and are pressed by applying pressure thereto from the side of the second main surface of the substrate at a specified temperature for a specified period in a vacuum environment, and the molding material melt is cured, so as to form the molding material,
   wherein in the molding material forming step, the second main surface of the substrate is fixed to a film-shaped jig, and when the substrate and the semiconductor chip are immersed into the molding material melt and pressed by applying pressure thereto, the pressure is applied from a side of the film-shaped jig.

2. The manufacturing method of a semiconductor device according to claim 1, wherein in the connecting step, the semiconductor chip is disposed such that the first main surface thereof, on which a circuit is formed, opposes the first main surface of the substrate.

3. The manufacturing method of a semiconductor device according to claim 2 further comprising: a second thinning step of, after the molding material forming step, thinning the semiconductor chip from a side of a second main surface thereof.

4. The manufacturing method of a semiconductor device according to claim 1, wherein the underfill material is a composite material of filler and resin in which the maximum particle diameter of the filler is 5 μm or below and whose filler content is 40 to 60 wt %.

5. The manufacturing method of a semiconductor device according to claim 4, wherein the molding material is a composite material of filler and resin whose filler content is over 75 wt % and in which the glass transition temperature of the resin is over 180° C.

6. The manufacturing method of a semiconductor device according to claim 1, wherein in the molding material forming step, a spacer is inserted between the second main surface of the substrate and the film-shaped jig, and the substrate is fixed to the film-shaped jig, so as to form the molding material that covers the second main surface of the substrate.

7. A manufacturing method of a semiconductor device comprising:
   forming connecting pads on a first main surface of a substrate so as to connect to input/output pads which are formed on a second main surface thereof via a plurality of penetrating electrodes that penetrate the substrate;
   disposing a semiconductor chip such that the semiconductor chip opposes the first main surface of the substrate and connecting the connecting pads to input/output terminals provided on a first main surface of the semiconductor chip such that each of the penetrating electrodes is aligned with each of the input/output terminals so as to oppose the input/output terminals;
   injecting an underfill material in a space between the substrate and the semiconductor chip;
   forming a molding material that encapsulates side surfaces of the semiconductor chip and the first main surface of the substrate, which is not covered with the underfill material and side surfaces of the semiconductor chip; and disposing a capacitor between the substrate and the semiconductor chip.

8. The manufacturing method of claim 7, wherein the semiconductor chip is disposed such that a first main surface thereof, on which a circuit is formed, opposes the first main surface of the substrate.

9. The manufacturing method of claim 7, wherein the underfill material is a composite material of filler and resin in which the maximum particle diameter of the filler is 5 µm or below and whose filler content is 40 to 60 wt %; and the molding material is a composite material of filler and resin whose filler content is over 75 wt % and in which the glass transition temperature of the resin is over 180° C.

10. The manufacturing method of claim 7, wherein each one of the penetrating electrodes is aligned with and electrically connected to each one of the input/output pads.

11. The manufacturing method of claim 10, wherein the connecting pads are disposed on the capacitor, wherein the input/output terminals of the semiconductor chip are flip-chip bonded to the connecting pads on the capacitor via bumps.

12. The manufacturing method of claim 11, wherein the capacitor comprises a first connecting pad, a second connecting pad, a first electrode and a second electrode, wherein the first and the second electrode are electrically connected to the first and the second connecting pad, respectively, wherein the first connecting pad being connected to a grounding terminal of the semiconductor chip and the second connecting pad being connected to a power supply terminal of the semiconductor chip.

13. The manufacturing method of claim 12, wherein the semiconductor chip is disposed such that a first main surface thereof, on which a circuit is formed, opposes the first main surface of the substrate.

14. The manufacturing method of claim 12, wherein the underfill material is a composite material of filler and resin in which the maximum particle diameter of the filler is 5 micro meter or below and whose filler content is 40 to 60 weight percent; and the molding material is a composite material of filler and resin whose filler content is over 75 weight percent and in which the glass transition temperature of the resin is over 180 Celsius.

* * * * *